United States Patent
An et al.

(10) Patent No.: US 12,327,603 B2
(45) Date of Patent: Jun. 10, 2025

(54) ZQ CALIBRATION CIRCUIT, OPERATION METHOD OF THE ZQ CALIBRATION CIRCUIT, AND SEMICONDUCTOR MEMORY DEVICE

(71) Applicant: Samsung Electronics Co., Ltd., Suwon-si (KR)

(72) Inventors: Donggun An, Suwon-si (KR); Jaehyeok Baek, Suwon-si (KR); Sungyong Cho, Suwon-si (KR); Moonchul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 18/235,848

(22) Filed: Aug. 19, 2023

(65) Prior Publication Data
US 2024/0127871 A1 Apr. 18, 2024

(30) Foreign Application Priority Data

Oct. 12, 2022 (KR) .......................... 10-2022-0130870
Jan. 13, 2023 (KR) .......................... 10-2023-0005528

(51) Int. Cl.
*G11C 7/10* (2006.01)

(52) U.S. Cl.
CPC .......... *G11C 7/1048* (2013.01); *G11C 7/1057* (2013.01); *G11C 7/1084* (2013.01); *G11C 2207/2254* (2013.01)

(58) Field of Classification Search
CPC ... G11C 7/1047; G11C 7/1057; G11C 7/1084; G11C 2207/2254
See application file for complete search history.

(56) References Cited

U.S. PATENT DOCUMENTS 7,528,626 B2 * 5/2009 Kim ................... H03K 19/0005
326/30
7,911,223 B2 3/2011 Kim et al.
(Continued)

FOREIGN PATENT DOCUMENTS

| KR | 1020200137361 A | 12/2020 |
|---|---|---|
| KR | 1020210105435 A | 8/2021 |
| KR | 1020220036386 A | 3/2022 |

OTHER PUBLICATIONS

Yong-Un Jeong, et. al., "A 0.64-pJ/Bit 28-GB/s/Pin High-Linearity Single-Ended PAM-4 Transmitter With an Impedance-Matched Driver and Three-Point ZQ Calibration for Memory Interface," IEEE Journal of Solid-State Circuits, Apr. 2021, pp. 1278-1287, vol. 56, No. 4.

*Primary Examiner* — Son L Mai
(74) *Attorney, Agent, or Firm* — Muir Patent Law, PLLC

(57) ABSTRACT

A ZQ calibration circuit included in a semiconductor memory device includes a reference voltage selector configured to output a reference voltage selected from among a first reference voltage and a second reference voltage generated based on a first supply voltage and a second supply voltage, in response to a selection signal, a ZQ engine configured to generate a pull-up code and a pull-down code based on the selected reference voltage, and a loop selector configured to output the selection signal according to whether each of the pull-up code and the pull-down code is toggled. Levels of the first and second reference voltages are different from each other, smaller than a level of the first supply voltage, and greater than a level of the second supply voltage.

20 Claims, 10 Drawing Sheets

(56) References Cited

U.S. PATENT DOCUMENTS

| | | |
|---|---|---|
| 7,969,182 B2 | 6/2011 | Kim et al. |
| 8,963,577 B2 | 2/2015 | Anderson et al. |
| 9,543,952 B2 * | 1/2017 | Lee .................... G11C 29/021 |
| 10,277,441 B2 | 4/2019 | Hollis |
| 10,938,392 B2 | 3/2021 | Jeong et al. |
| 2005/0259772 A1 | 11/2005 | Voutilainen |
| 2008/0100333 A1 | 5/2008 | Kim et al. |
| 2021/0091980 A1 | 3/2021 | Farzan et al. |
| 2022/0083244 A1 | 3/2022 | Um et al. |

* cited by examiner

ZQ CALIBRATION CIRCUIT, OPERATION METHOD OF THE ZQ CALIBRATION CIRCUIT, AND SEMICONDUCTOR MEMORY DEVICE

CROSS-REFERENCE TO RELATED APPLICATIONS

This application is based on and claims priority under 35 U.S.C. § 119 to Korean Patent Application Nos. 10-2022-0130870 filed on Oct. 12, 2022 and 10-2023-0005528 filed on Jan. 13, 2023, in the Korean Intellectual Property Office, the disclosure of each of which is incorporated by reference herein in its entirety.

BACKGROUND

The present disclosure of inventive concept relates to an electronic device, and more particularly, to a ZQ calibration circuit performing ZQ calibration using a different reference voltage for each loop, an operation method of the ZQ calibration circuit, and a semiconductor memory device.

Semiconductor memories are widely used to store data in various electronic devices such as computers, wireless communication devices, etc. To access data stored in a semiconductor memory, at least one stored state of the semiconductor memory may be read or detected. To store data, components of a device may write or program the state of the semiconductor memory.

In most cases, the semiconductor memory receives various signals from the outside through input pads and transmits internal signals to the outside through output pads. To minimize a delay time required for signal transmission due to an increased operating speed of electronic devices, a swing width of a signal transmitted and received between semiconductor memories has been gradually reduced. However, as the swing width of the signal has been decreased, the influence of external noise increases, and signal reflection caused by an impedance mismatch becomes serious in an interface. When impedance mismatching occurs, it is difficult to transfer data at high speed, and data output from the semiconductor memory may be distorted.

Semiconductor memories requiring a high-speed operation employ an impedance matching circuit called an on-die termination circuit near a pad inside a chip. The impedance matching circuit may match an impedance by performing ZQ calibration. ZQ calibration is a process of generating a pull-up code and a pull-down code that change as process, voltage, and temperature (PVT) conditions change. A resistance value of an on-die termination device is adjusted through codes generated as a result of ZQ calibration. Generally, ZQ calibration is performed based on one reference voltage during one loop. However, in a pulse modulation method such as Pulse-Amplitude Modulation (PAM)-3 and PAM-4, there are cases where the impedance of a data driver of the semiconductor memory changes as the level of a signal or a voltage changes. Therefore, it is important to generate a pull-up code and a pull-down code for accurate matching of the impedance.

SUMMARY

The present disclosure of the inventive concept provides a ZQ calibration circuit including an additional pull-down circuit compensating for a change in an impedance according to a change in the level of drain-source voltage (e.g., Vds) of a transistor, an operation method of the ZQ calibration circuit, and a semiconductor memory device.

According to an aspect of the inventive concept, there is provided a ZQ calibration circuit included in a semiconductor memory device including a reference voltage selector configured to output a reference voltage selected from among a first reference voltage and a second reference voltage generated based on a first supply voltage and a second supply voltage, in response to a selection signal, a ZQ engine configured to generate a pull-up code and a pull-down code based on the selected reference voltage, and a loop selector configured to output the selection signal according to whether each of the pull-up code and the pull-down code is toggled. Levels of the first and second reference voltages are different from each other, smaller than a level of the first supply voltage, and greater than a level of the second supply voltage.

According to another aspect of the inventive concept, there is provided a semiconductor memory device including a ZQ pad, a DQ pad, a ZQ calibration circuit configured to perform a ZQ calibration operation by using a ZQ resistor connected to a ZQ pad and generate a ZQ code, and a DQ driver configured to determine a termination resistance value of the DQ pad based on the ZQ code. The ZQ calibration circuit includes a reference voltage selector configured to output a reference voltage selected from among a first reference voltage and a second reference voltage generated based on a first supply voltage and a second supply voltage, in response to a selection signal, a ZQ engine configured to generate a pull-up code of the ZQ code and a pull-down code of the ZQ code based on the selected reference voltage, and a loop selector configured to output the selection signal according to whether each of the pull-up code and the pull-down code is toggled. Levels of the first and second reference voltages are different from each other, smaller than a level of the first supply voltage, and greater than a level of the second supply voltage.

According to another aspect of the inventive concept, there is provided an operation method of a ZQ calibration circuit including generating a first reference voltage and a second reference voltage based on a first supply voltage and a second supply voltage, selecting a reference voltage from among the first reference voltage and the second reference voltage according to a selection signal, generating a pull-up code and a pull-down code based on the selected reference voltage, and generating the selection signal according to whether each of the pull-up code and the pull-down code is toggled. Levels of the first and second reference voltages are different from each other, are smaller than a level of the first supply voltage, and are greater than a level of the second supply voltage.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Hereinafter, example embodiments of the inventive concept will be described in detail with reference to the accompanying drawings.

Figure 1:
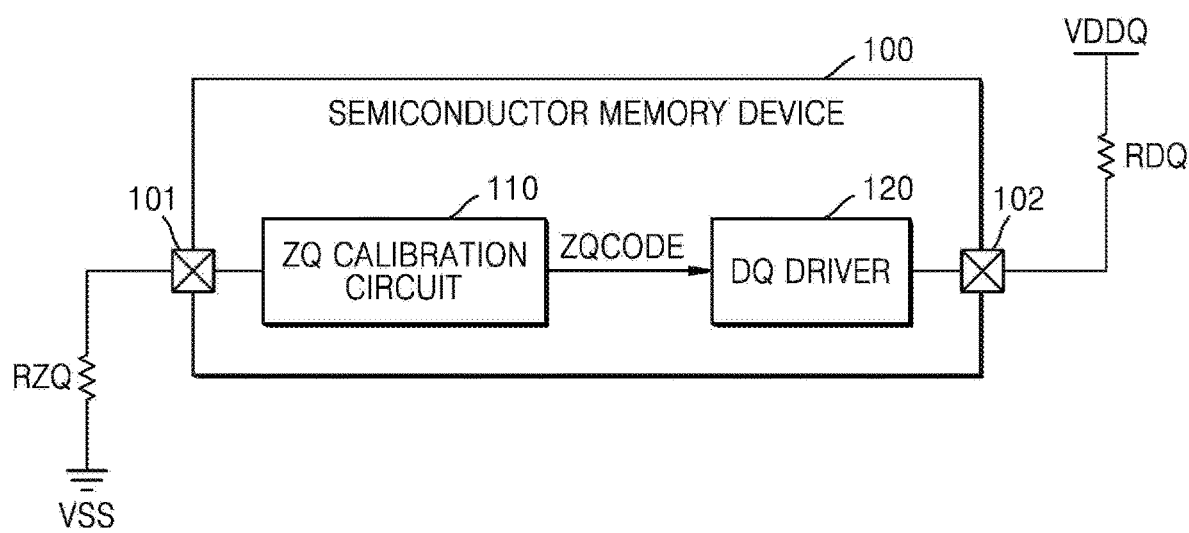
FIG. 1 is a diagram illustrating a semiconductor memory device according to some embodiments.

FIG. 1 is a diagram illustrating a semiconductor memory device according to some embodiments.

A semiconductor memory device 100 may be implemented as a volatile memory device. The volatile memory device may include, for example, Dynamic Random Access Memory (DRAM), Static Random Access Memory (SRAM), mobile DRAM, Double Data Rate Synchronous Dynamic Random Access Memory (DDR SDRAM), Low Power DDR (LPDDR) SDRAM, Graphics DDR (GDDR) SDRAM, Rambus Dynamic Random Access Memory (RDRAM), etc. However, the semiconductor memory device 100 is not limited thereto, and in some embodiments, may be implemented as a non-volatile memory device.

The semiconductor memory device 100 may include a ZQ pad 101 and a DQ pad 102. The ZQ pad 101 may be a pad for adjusting an impedance. The ZQ pad 101 may be connected to a ZQ resistor RZQ present outside. A supply voltage VSS may be connected to one end of the ZQ resistor RZQ. The DQ pad 102 may be a pad for inputting/outputting data. The DQ pad 102 may be connected to a DQ resistor RDQ present outside. A supply voltage VDDQ may be connected to one end of the DQ resistor RDQ. A level of the supply voltage VDDQ may be higher than a level of the supply voltage VSS. In the inventive concept, the supply voltage VDDQ may be referred to as a first supply voltage, and the supply voltage VSS may be referred to as a second supply voltage. According to an embodiment, the second supply voltage VSS may be designed as ground.

Although not shown, the semiconductor memory device 100 may further include a command pad and an address pad. In the inventive concept, the term "pad" may refer broadly to an electrical interconnection to an integrated circuit. For example, the term "pad" may include a pin or another electrical contact point on an integrated circuit.

The semiconductor memory device 100 may include a ZQ calibration circuit 110 and a DQ driver 120.

The ZQ calibration circuit 110 may perform a ZQ calibration operation by using the ZQ resistor RZQ connected to the ZQ pad 101 and generate a ZQ code ZQCODE. Specifically, for example, the ZQ calibration circuit 110 may repeatedly perform a calibration operation by using the ZQ resistor RZQ and generate the ZQ code ZQCODE of converging n-bits, n may be an integer greater than or equal to 1. The ZQ calibration circuit 110 may provide the ZQ code ZQCODE to the DQ driver 120.

The DQ driver 120 may determine a termination resistance value of the DQ pad 102 based on the ZQ code ZQCODE.

Figure 2:
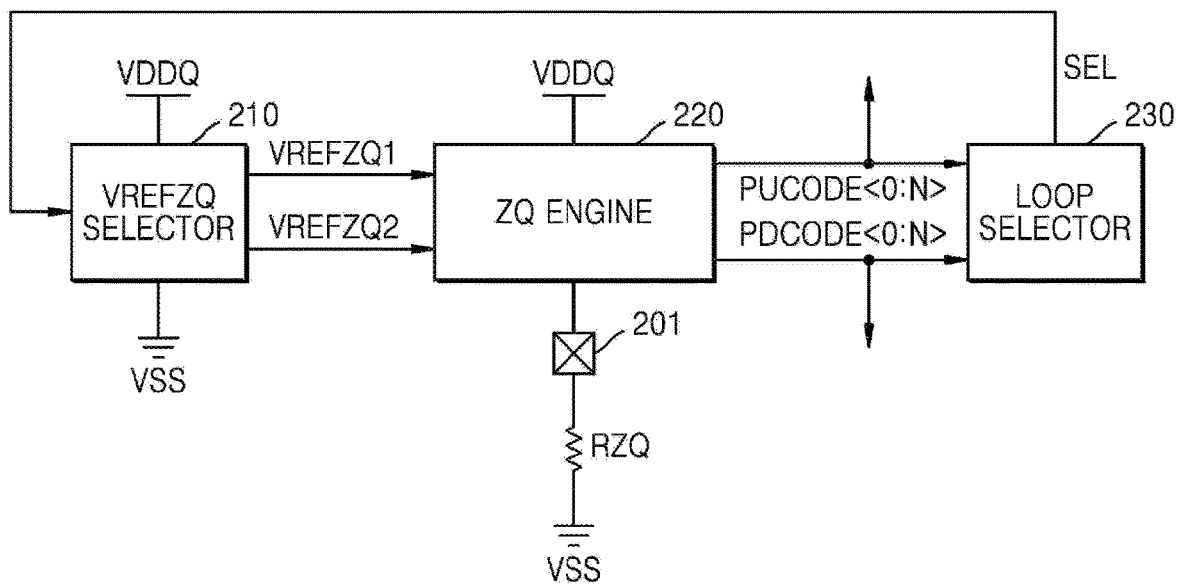
FIG. 2 is a diagram illustrating a ZQ calibration circuit according to some embodiments.

FIG. 2 is a diagram illustrating a ZQ calibration circuit according to some embodiments.

Referring to FIG. 2, a ZQ calibration circuit 200 may be a circuit compensating for a variation in an impedance according to a level of a voltage in a pulse-amplitude modulation (PAM)-3 and a PAM-4. The ZQ calibration circuit 200 may include a reference voltage selector 210, a ZQ engine 220, and a loop selector 230.

The reference voltage selector 210 may output a reference voltage selected according to a selection signal SEL from among a first reference voltage VREFZQ1 and a second reference voltage VREFZQ2 generated by the first supply voltage VDDQ and the second supply voltage VSS. The reference voltage selector 210 may generate the first reference voltage VREFZQ1 and/or the second reference voltage VREFZQ2 based on the first supply voltage VDDQ and the second supply voltage VSS. Also, the reference voltage selector 210 may output the first reference voltage VREFZQ1 or the second reference voltage VREFZQ2 according to the selection signal SEL (e.g., a logic level of the selection signal SEL). For example, the reference voltage selector 210 may output the first reference voltage VREFZQ1 when the selection signal SEL from the loop selector 230 has a first logic level, and output the second reference voltage VREFZQ2 when the selection signal SEL from the loop selector 230 has a second logic level different from the first logic level.

The ZQ calibration circuit 200 may perform a ZQ calibration operation during a first loop and a second loop after the first loop. In some embodiments, the reference voltage selector 210 may provide the first reference voltage VREFZQ1 from among the first reference voltage VREFZQ1 and the second reference voltage VREFZQ2 to the ZQ engine 220 during the first loop. Also, the reference voltage selector 210 may provide the second reference voltage VREFZQ2 from among the first reference voltage VREFZQ1 and the second reference voltage VREFZQ2 to the ZQ engine 220 during the second loop.

In the first loop, the first reference voltage VREFZQ1 may be applied to the ZQ engine 220 to perform a ZQ calibration. During the first loop, a termination resistance value of the DQ pad 102 of FIG. 1 may be determined as a first resistance value, and a level of a voltage generated on the DQ pad 102 may be a first level. In the second loop, the second reference voltage VREFZQ2 may be applied to the ZQ engine 220 to perform the ZQ calibration. During the second loop, the termination resistance value of the DQ pad 102 of FIG. 1 may be determined as a second resistance value, and the level of the voltage generated on the DQ pad 102 may be a second level.

In some embodiments, a level of the first reference voltage VREFZQ1 may be higher than a level of the second reference voltage VREFZQ2 and lower than a level of the first supply voltage VDDQ. The level of the second reference voltage VREFZQ2 may be higher than a level of the second supply voltage VSS. Specifically, for example, when the ZQ calibration circuit 200 is included in a GDDR7 that may be driven at a PAM-3, a voltage of the PAM-3 in the GDDR7 may be ¾VDDQ and/or ½VDDQ. Accordingly, the first reference voltage VREFZQ1 may be ¾VDDQ, and the second reference voltage VREFZQ2 may be ½VDDQ. However, embodiments are not limited thereto.

The ZQ engine 220 may receive the first supply voltage VDDQ and the second supply voltage VSS. The ZQ engine 220 may be connected between a line to which the first supply voltage VDDQ is applied and the ZQ pad 201. The ZQ pad 201 may be connected to the ZQ resistor RZQ. One end of the ZQ resistor RZQ may be connected to a line to which the second supply voltage VSS is applied.

The ZQ engine 220 may output a ZQ code (e.g., the ZQ code ZQCODE of FIG. 1) based on the selected reference voltage. Specifically, the ZQ engine 220 may perform the ZQ calibration based on the selected reference voltage (e.g., the first reference voltage VREFZQ1 or the second reference voltage VREFZQ2) to generate a pull-up code PUCODE<0:N> and a pull-down code PDCODE<0:N> of the ZQ code. The pull-up code PUCODE<0:N> and pull-down code PDCODE<0:N> generated as a result of performing the ZQ calibration are provided to a DQ driver (e.g., the DQ driver 120 of FIG. 1), and determine the termination resistance value of the DQ pad 102. Meanwhile, the pull-up code PUCODE<0:N> and the pull-down code PDCODE<0:N> may be provided to the loop selector 230.

The loop selector 230 may be configured to output the selection signal SEL according to whether each of the pull-up code PUCODE<0:N> and the pull-down code PDCODE<0:N> is toggled. In some embodiments, when both the pull-up code PUCODE<0:N> and the pull-down code PDCODE<0:N> are toggled, the loop selector 230 may output the selection signal SEL notifying that a loop in the ZQ engine 220 ends. When any one of the pull-up code PUCODE<0:N> and the pull-down code PDCODE<0:N> is not toggled, the loop selector 230 may not output the selection signal SEL. In some embodiments, when both the pull-up code PUCODE<0:N> and the pull-down code PDCODE<0:N> are toggled, the selection signal SEL having a first logic level may be output. For example, the loop selector 230 may output the selection signal SEL having a logic high level "H" when one bit of the pull-up code PUCODE<0:N> and one bit of the pull-down code PDCODE<0:N> are toggled. When any one of the pull-up code PUCODE<0:N> and the pull-down code PDCODE<0:N> is not toggled, the selection signal SEL having a second logic level different from the first logic level may be output. For example, the loop selector 230 may output the selection signal SEL having a logic low level "L" when any one of bits of each of the pull-up code PUCODE<0:N> and the pull-down code PDCODE<0:N> is not toggled.

As described above, a ratio of level separation mismatch (RLM) may be improved in a pulse amplitude modulation method such as the PAM-3 and the PAM-4.

Figure 3:
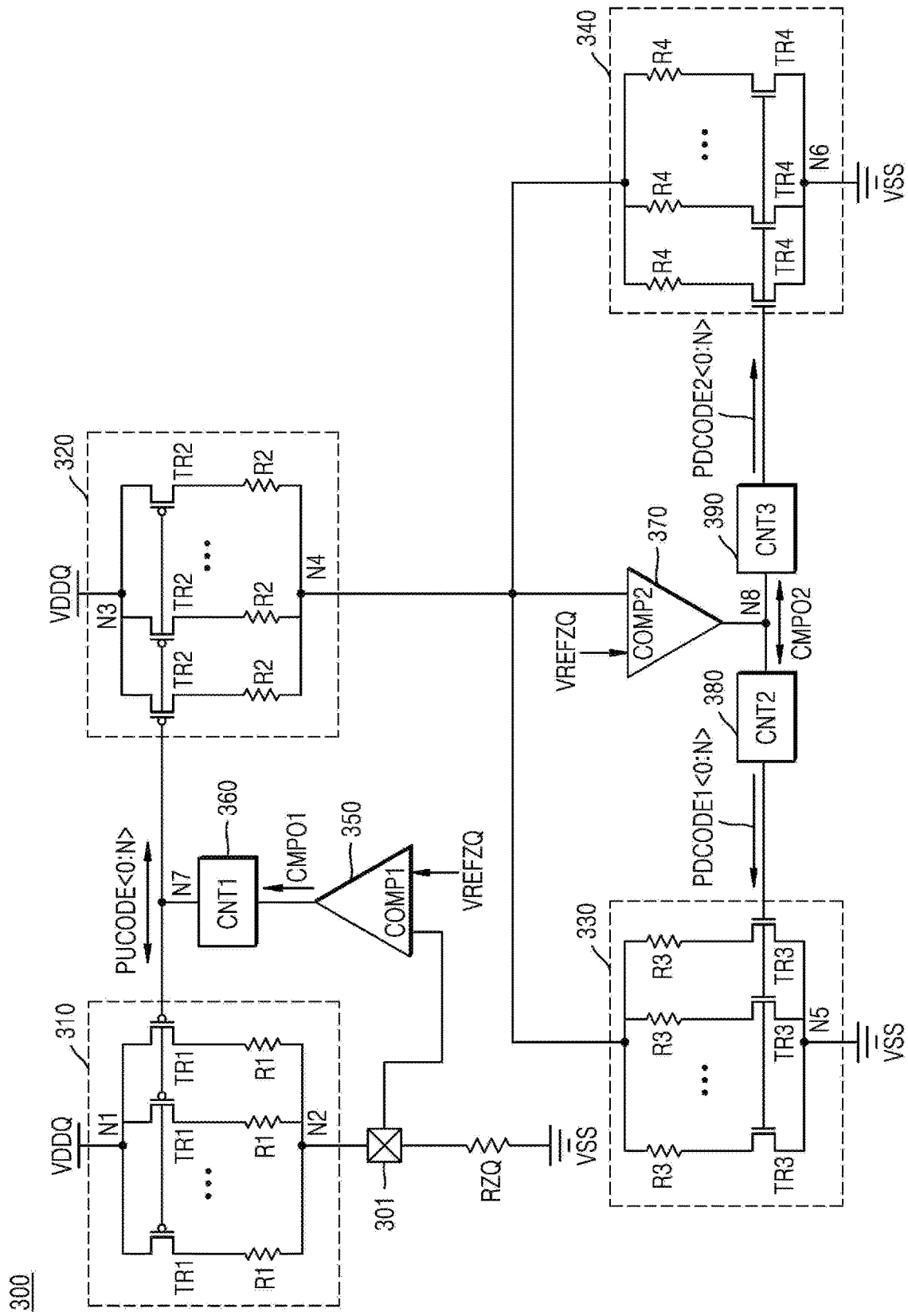
FIG. 3 is a circuit diagram illustrating a ZQ engine according to some embodiments.

FIG. 3 is a circuit diagram illustrating a ZQ engine according to some embodiments.

Referring to FIG. 3, a ZQ engine 300 may configure a structure of a loop corresponding to each level of a signal in a method such as a PAM-3 and a PAM-4. The ZQ engine 300 may include a first pull-up circuit 310, a second pull-up circuit 320, a first pull-down circuit 330, a second pull-down circuit 340, a first comparator 350, a first counter 360, a second comparator 370, a second counter 380, and a third counter 390.

The first pull-up circuit 310 may be connected between a first node N1 and a second node N2. For example, the terms "connected" and/or "coupled" may mean that two or more elements are in direct physical or electrical contact with each other. The terms "connected" and/or "coupled" may also mean that two or more elements are not in direct contact with each other but still cooperate or interact with each other. The first pull-up circuit 310 may be referred to as a first pull-up replica.

The first supply voltage VDDQ may be applied or supplied to the first node N1. A ZQ pad 301 may be connected to the second node N2. The first pull-up circuit 310 may be connected to the ZQ pad 301 through the second node N2.

The first pull-up circuit 310 may receive the pull-up code PUCODE<0:N> to adjust a resistance value of the first pull-up circuit 310. In some embodiments, the first pull-up circuit 310 includes one or more first transistors TR1 and one or more first resistors R1 connected in series between the first node N1 and the second node N2.

The first transistor TR1 may include a first electrode connected to the first node N1, a second electrode connected to the first resistor R1, and a gate electrode receiving the pull-up code PUCODE<0:N>. The first transistor TR1 may be implemented as a p-type transistor (or a PMOS transistor). The gate of the first transistor TR1 may be connected to a seventh node N7. A specific bit of the pull-up code PUCODE<0:N> may be input to a gate of a first transistor TR1 corresponding thereto. The first transistor TR1 may be turned on or off according to a bit value of the pull-up code PUCODE<0:N>.

The first resistor R1 may be connected between the second electrode of the first transistor TR1 and the second node N2.

The number of each of the first transistors TR1 and the first resistors R1 may correspond to the number of bit digits of the pull-up code PUCODE<0:N>. In some embodiments, a size ratio of the first transistor TR1 and/or a resistance value ratio of the first resistor R1 may be set differently according to a binary weight of the relevant pull-up code PUCODE<0:N>.

The second pull-up circuit 320 may be connected between a third node N3 and a fourth node N4. The first supply voltage VDDQ may be supplied to the third node N3. Herein, the first node N1 and the third node N3 may be connected to each other. An input terminal of the second comparator 370 may be connected to the fourth node N4. The second pull-up circuit 320 may be referred to as a second pull-up replica.

The second pull-up circuit 320 may receive the pull-up code PUCODE<0:N> to adjust a resistance value of the second pull-up circuit 320. In some embodiments, the second pull-up circuit 320 may include one or more second transistors TR2 and one or more second resistors R2 connected in series between the third node N3 and the fourth node N4. The second transistor TR2 may be implemented as a p-type transistor (or a PMOS transistor).

The second transistor TR2 may include a first electrode connected to the third node N3, a second electrode connected to the second resistor R2, and a gate electrode receiving the pull-up code PUCODE<0:N>. The gate of the second transistor TR2 may be connected to the seventh node N7. Each second transistor TR2 may be turned on or off according to a bit value of the pull-up code PUCODE<0:N> corresponding thereto. The second transistor TR2 may be implemented as a p-type transistor (or a PMOS transistor).

The second resistor R2 may be connected between the second electrode of the second transistor TR2 and the fourth node N4.

The number of each of the second transistor TR2 and the second resistors R2 may correspond to the number of bit digits of the pull-up code PUCODE<0:N>.

The first pull-down circuit 330 may be connected between the fourth node N4 and a fifth node N5. The second supply voltage VSS may be supplied to the fifth node N5. The first pull-down circuit 330 may be referred to as a first pull-down replica.

The first pull-down circuit 330 may receive a first pull-down code PDCODE1<0:N> to adjust a resistance value of the first pull-down circuit 330. In some embodiments, the first pull-down circuit 330 may include one or more third resistors R3 and one or more third transistors TR3 connected in series between the fourth node N4 and the fifth node N5.

The third resistor R3 may be connected to the fourth node N4 and a first electrode of the third transistor TR3.

The third transistor TR3 may include a first electrode connected to the third resistor R3, a second electrode connected to the fifth node N5, and a gate electrode receiving the first pull-down code PDCODE1<0:N>. Each third transistor TR3 may be turned on or off according to a bit value of the first pull-down code PDCODE1<0:N> corresponding thereto. The third transistor TR3 may be implemented as an n-type transistor (or an NMOS transistor).

The number of each of the third resistor R3 and the third transistor TR3 may correspond to the number of bit digits of the first pull-down code PDCODE1<0:N>.

The second pull-down circuit 340 may be connected between the fourth node N4 and a sixth node N6. The second supply voltage VSS may be supplied to the sixth node N6. The second pull-down circuit 340 may be referred to as a second pull-down replica.

The second pull-down circuit 340 may receive a second pull-down code PDCODE2<0:N> to adjust a resistance value of the second pull-down circuit 340. In some embodiments, the second pull-down circuit 340 may include one or more fourth resistors R4 and one or more fourth transistors TR4 connected in series between the fourth node N4 and the sixth node N6.

The fourth resistor R4 may be connected to the fourth node N4 and a first electrode of the fourth transistor TR4.

The fourth transistor TR4 may include the first electrode connected to the fourth resistor R4, a second electrode connected to the sixth node N6, and a gate electrode receiving the second pull-down code PDCODE2<0:N>. Each fourth transistor TR4 may be turned on or off according to a bit value of the second pull-down code PDCODE2<0:N> corresponding thereto. The fourth transistor TR4 may be implemented as an n-type transistor (or an NMOS transistor).

The number of each of the fourth resistors R4 and the fourth transistors TR4 may correspond to the number of bit digits of the second pull-down code PDCODE2<0:N>.

The first comparator 350 may include a first input terminal connected to the ZQ pad 301, a second input terminal to which a reference voltage VREFZQ is input, and an output terminal to which a first comparison output signal CMPO1 is output. The first comparator 350 may output the first comparison output signal CMPO1 based on a voltage generated on the ZQ pad 301 and the reference voltage VREFZQ. For example, the first comparator 350 may compare a level of the voltage generated on the ZQ pad 301 with a level of the reference voltage VREFZQ to output the first comparison output signal CMPO1 of a logic high level or a logic low level (or up/down).

The first counter 360 may receive the first comparison output signal CMPO1 and generate the pull-up code PUCODE<0:N>. The pull-up code PUCODE<0:N> may be output to the seventh node N7. The pull-up code PUCODE<0:N> may be a signal for turning on or off transistors connected in parallel in each of the first pull-up circuit 310 and the second pull-up circuit 320. The pull-up code PUCODE<0:N> is provided to the first pull-up circuit 310 and the second pull-up circuit 320, and thus, each of the first pull-up circuit 310 and the second pull-up circuit 320 may adjust a resistance value thereof. The resistance value of the first pull-up circuit 310 affects the voltage of the ZQ pad 301, and the above-described operation is repeated.

The second comparator 370 may include a first input terminal to which the reference voltage VREFZQ is input, a second input terminal connected to the fourth node N4, and an output terminal to which a second comparison output signal CMPO2 is output. The second comparator 370 may compare a level of voltage generated on the fourth node N4 with the level of the reference voltage VREFZQ to output the second comparison output signal CMPO2 of a logic high level or a logic low level.

The second counter 380 may receive the second comparison output signal CMPO2 and generate the first pull-down code PDCODE1<0:N>. The first pull-down code PDCODE1<0:N> may be a signal for turning on or off each of transistors connected in parallel in the first pull-down circuit 330. The first pull-down code PDCODE1<0:N> is provided to the first pull-down circuit 330, and thus, the first pull-down circuit 330 may adjust a resistance value thereof.

The third counter 390 may receive the second comparison output signal CMPO2 and generate the second pull-down code PDCODE2<0:N>. The second pull-down code PDCODE2<0:N> may be a signal for turning on or off each of transistors connected in parallel in the second pull-down circuit 340.

As described above, an additional pull-down circuit compensating for a change in an impedance according to a change in a level of a drain-source voltage (e.g., Vds) of a transistor is designed, and thus, an RLM may be improved in a pulse amplitude modulation method such as a PAM-3 and a PAM-4.

As described above, a final ZQ code compensating for a part of the ZQ engine 300 where the impedance varies is converted, and thus, impedance matching according to a level of the PAM-3 is achieved, thereby improving characteristics of the RLM.

Figure 4:
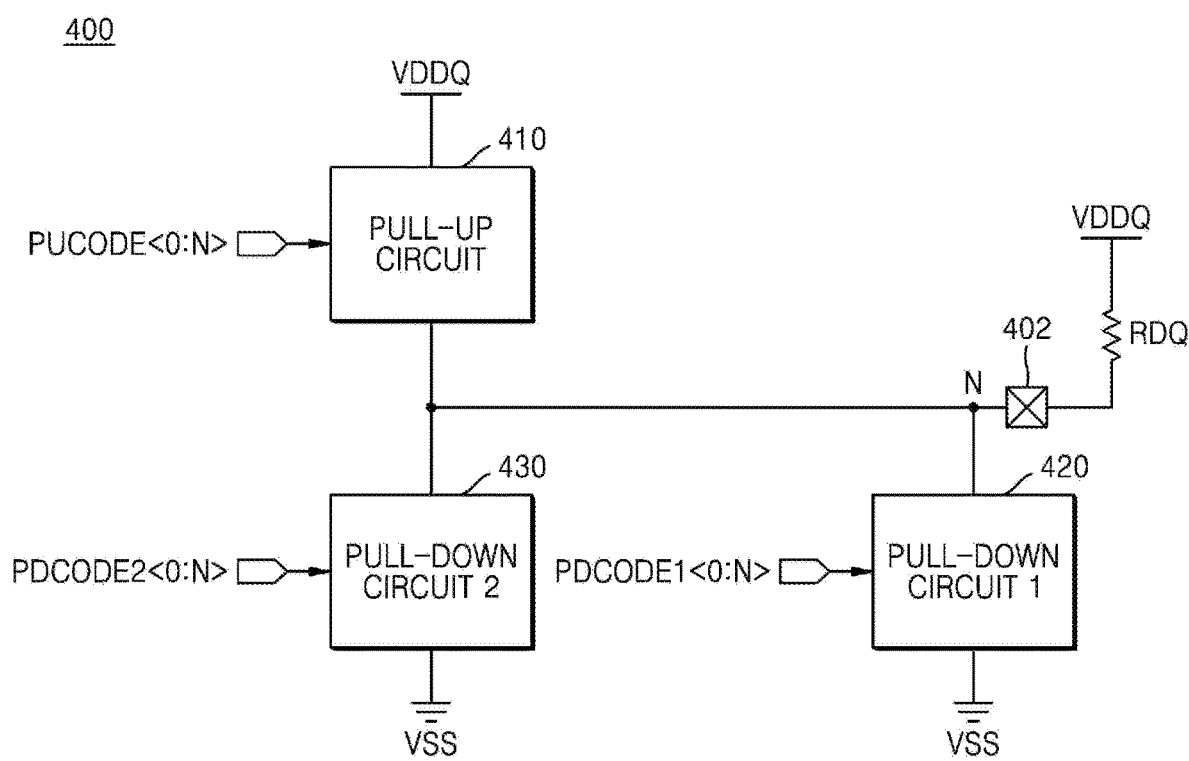
FIG. 4 is a diagram illustrating a DQ driver according to some embodiments.

FIG. 4 is a diagram illustrating a DQ driver according to some embodiments.

Referring to FIGS. 3 and 4, a DQ driver 400 may include a pull-up circuit 410, a first pull-down circuit 420 and a second pull-down circuit 430.

The pull-up circuit 410 may be connected between a line to which the first supply voltage VDDQ is supplied and the node N. The pull-up circuit 410 may receive the pull-up code PUCODE<0:N> to adjust a resistance value of the pull-up circuit 410. The pull-up circuit 410 may include a first pull-up circuit 310 and/or a second pull-up circuit 320. The pull-up circuit 410 may be referred to as a DQ pull-up circuit.

The first pull-down circuit 420 may be connected between the node N and a line to which the second supply voltage VSS is supplied. The first pull-down circuit 420 may receive the first pull-down code PDCODE1<0:N> to adjust a resistance value of the first pull-down circuit 420. The first pull-down circuit 420 may be referred to as a first DQ pull-down circuit.

The second pull-down circuit 430 may be connected between the node N and the line to which the second supply voltage VSS is supplied, and receive the second pull-down code PDCODE2<0:N> to adjust a resistance value of the second pull-down circuit 430. The second pull-down circuit 430 may be referred to as a second DQ pull-down circuit.

A DQ pad 402 may be connected to the node N. A DQ resistor RDQ may be connected to the DQ pad 402. The first supply voltage VDDQ may be supplied to one end of the DQ resistor RDQ.

Figure 5A:
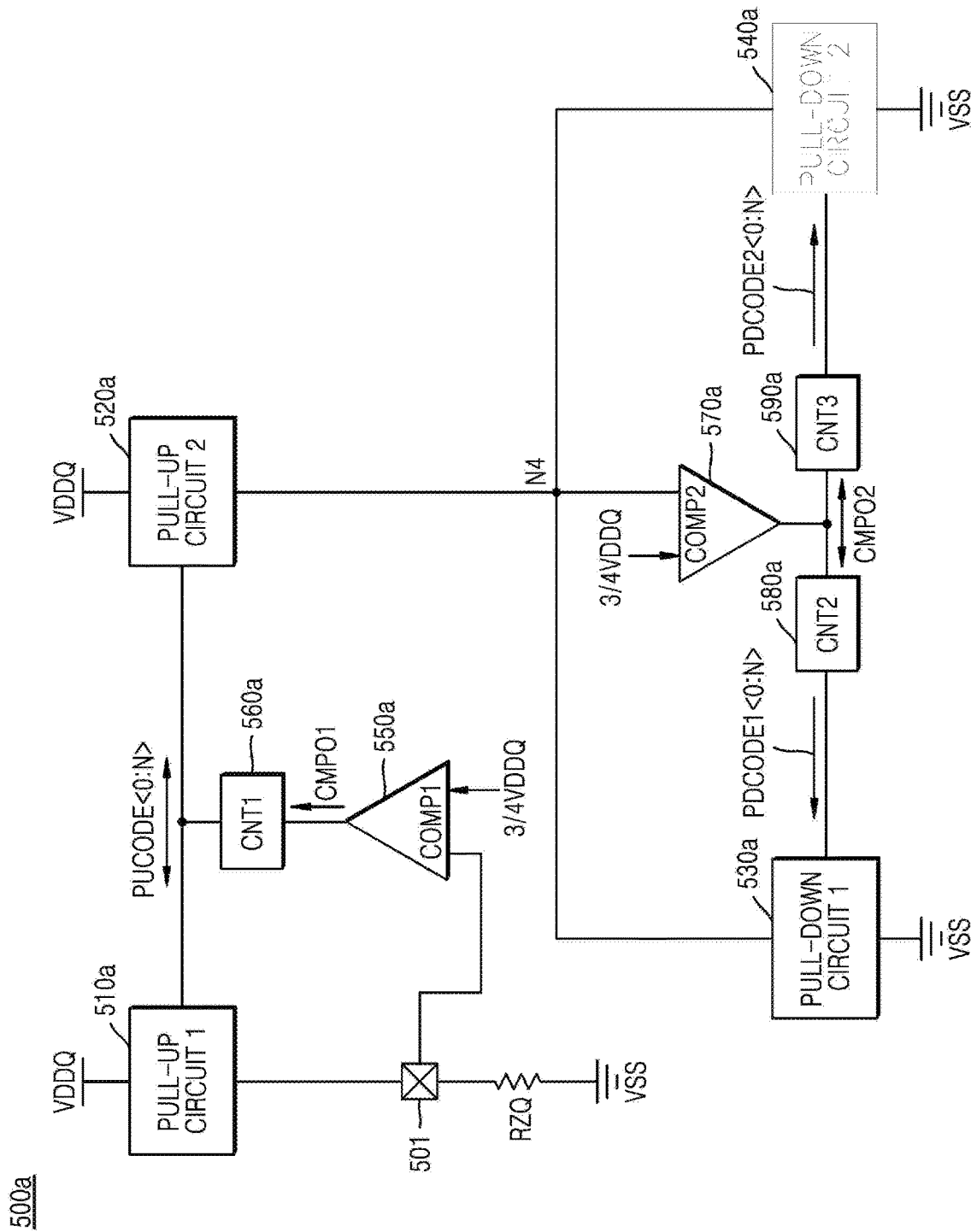
FIGS. 5A and 5B are diagrams respectively illustrating a ZQ engine and a DQ driver to which a first reference voltage of the inventive concept is supplied according to some embodiments.
Figure 5B:
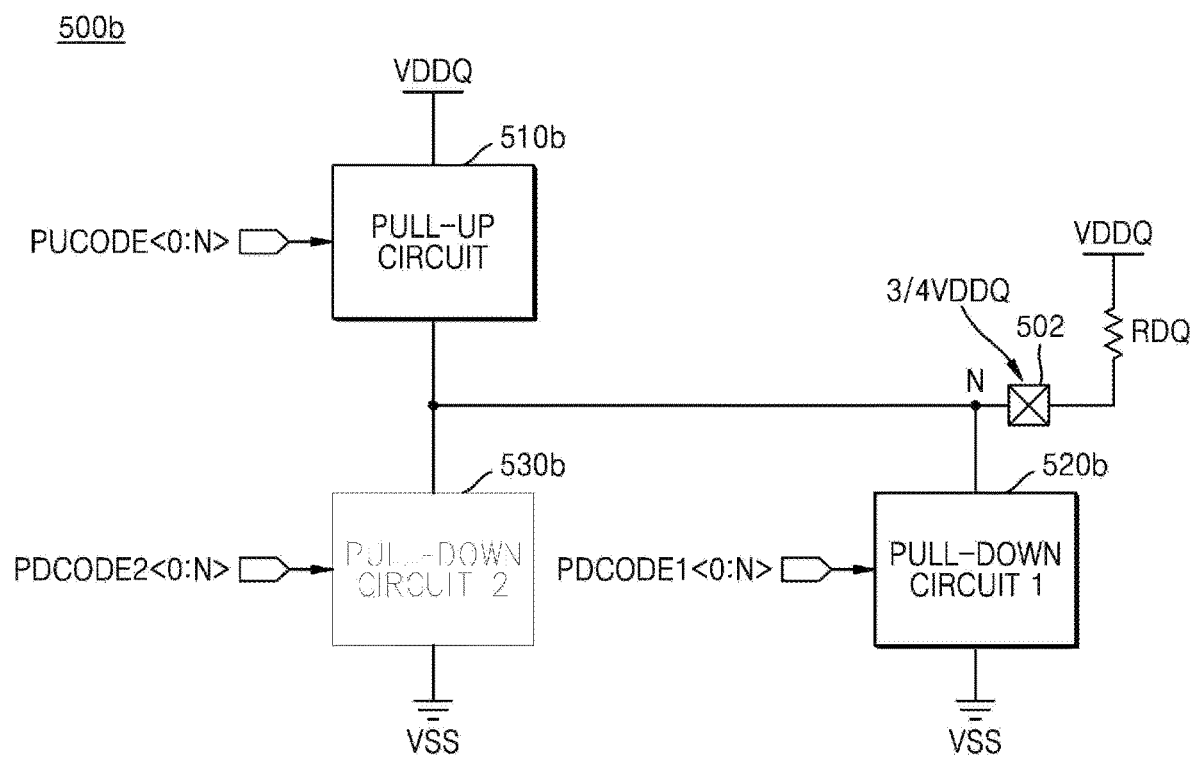

FIGS. 5A and 5B are diagrams illustrating a ZQ engine and a DQ driver to which a first reference voltage of the inventive concept is supplied according to some embodiments. Specifically, FIGS. 5A and 5B are diagrams illustrating a termination resistance value of a DQ pad 502 by a ZQ calibration performed during a first loop.

Referring again to FIG. 2, the reference voltage selector 210 may provide the first reference voltage VREFZQ1 from among the first reference voltage VREFZQ1 and the second reference voltage VREFZQ2 to a first comparator 550a and a second comparator 570a during the first loop. In some embodiments, the first reference voltage VREFZQ1 may correspond to $3/4$ of the first supply voltage VDDQ in a PAM-3.

Referring to FIG. 5A, a first reference voltage $3/4$VDDQ may be input to the first comparator 550a and the second comparator 570a of a ZQ engine 500a.

The first comparator 550a may compare a level of a voltage generated on a ZQ pad 501 with a level of the first reference voltage $3/4$VDDQ and output the first comparison output signal CMPO1. A first counter 560a may output the pull-up code PUCODE<0:N> based on the first comparison output signal CMPO1. Each of a first pull-up circuit 510a and a second pull-up circuit 520a may adjust a resistance value thereof according to the pull-up code PUCODE<0:N>.

The second comparator 570a may compare a level of a voltage generated on the fourth node N4 with a level of the first reference voltage $3/4$VDDQ and output the second comparison output signal CMPO2. A second counter 580a may output the first pull-down code PDCODE1<0:N> based on the second comparison output signal CMPO2. Although not shown, the second counter 580a may receive the selection signal SEL from the loop selector 230 of FIG. 2. For example, the second counter 580a may generate the first pull-down code PDCODE1<0:N> when the selection signal SEL has a logic low level "L." A third counter 590a may output the second pull-down code PDCODE2<0:N> based on the second comparison output signal CMPO2. Although not shown, the third counter 590a may receive the selection signal SEL from the loop selector 230 of FIG. 2. For example, the third counter 590a may provide the second pull-down code PDCODE2<0:N> to turn off the second pull-down circuit 540a when the selection signal SEL has a logic low level "L." A first pull-down circuit 530a may receive the first pull-down code PDCODE1<0:N> during the first loop and set a first resistance value. A second pull-down circuit 540a may receive the second pull-down code PDCODE2<0:N> during the first loop and be turned off.

In some embodiments, a resistance value of the ZQ resistor RZQ may be 120Ω. At this time, when the first reference voltage $3/4$VDDQ is input to the ZQ engine 500a in the first loop, a resistance value of the first pull-up circuit 510a may be 40Ω, a resistance value of the second pull-up circuit 520a may be 80/3Ω, and the first resistance value of the first pull-down circuit 530a may be 80Ω.

Referring to FIG. 5B, a pull-up circuit 510b included in a DQ driver 500b may set the first resistance value according to the pull-up code PUCODE<0:N> input during the first loop. A first pull-down circuit 520b may set the first resistance value according to the first pull-down code PDCODE1<0:N> input during the first loop. A second pull-down circuit 530b may be turned off according to the second pull-down code PDCODE2<0:N> input during the first loop.

In some embodiments, the resistance value of the ZQ resistor RZQ may be 120Ω and the resistance value of the DQ resistor RDQ may be 40Ω. In this regard, when the first reference voltage $3/4$VDDQ is input to the ZQ engine 500a in the first loop, the first resistance value of each of the pull-up circuit 510b and the first pull-down circuit 520b may be 80Ω. A voltage having the same level as the level of the first reference voltage $3/4$VDDQ may be generated on the DQ pad 502.

As described above, an impedance matching code is finally generated by directly compensating for variations in impedances of the first pull-down circuit 530a and the second pull-down circuit 540a within the ZQ engine 500a, and thus, characteristics of an RLM may be improved.

Figure 6A:
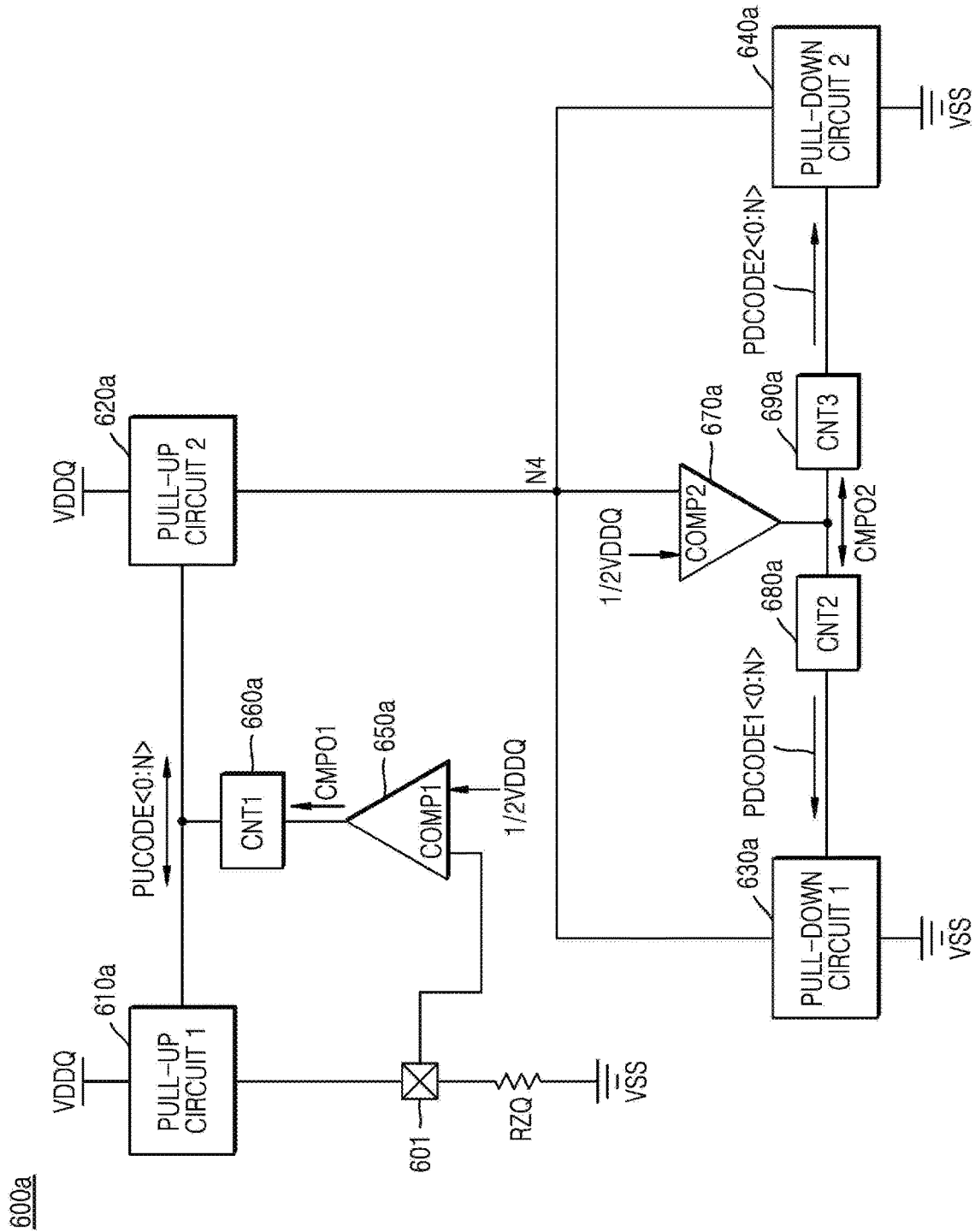
FIGS. 6A and 6B are diagrams respectively illustrating a ZQ engine and a DQ driver to which a second reference voltage of the inventive concept is supplied according to some embodiments.
Figure 6B:
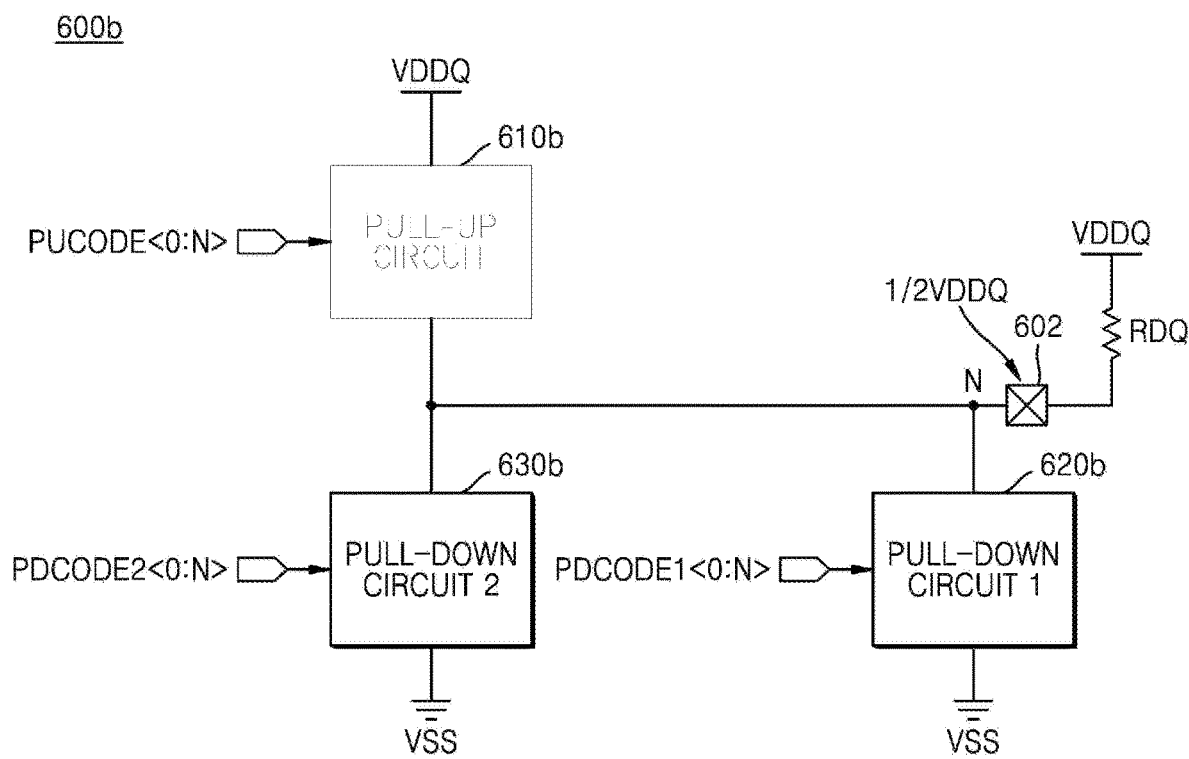

FIGS. 6A and 6B are diagrams illustrating a ZQ engine and a DQ driver to which a second reference voltage of the inventive concept is supplied according to some embodiments. Specifically, FIGS. 6A and 6B are diagrams illustrating a termination resistance value of the DQ pad 502 by a ZQ calibration performed during a second loop.

Referring again to FIG. 2, the reference voltage selector 210 may provide the second reference voltage VREFZQ2 from among the first reference voltage VREFZQ1 and the second reference voltage VREFZQ2 to a first comparator 650a and a second comparator 670a during the second loop after the first loop. In some embodiments, the second reference voltage VREFZQ2 may correspond to half ($1/2$) of the first supply voltage VDDQ in a PAM-3.

Referring to FIG. 6A, a second reference voltage $1/2$VDDQ may be input to the first comparator 650a and the second comparator 670a of a ZQ engine 600a.

The first comparator 650a may compare a level of a voltage generated on a ZQ pad 601 with a level of the second reference voltage $1/2$VDDQ and output the first comparison output signal CMPO1. A first counter 660a may output the pull-up code PUCODE<0:N> based on the first comparison output signal CMPO1. Each of a first pull-up circuit 610a and a second pull-up circuit 620a may adjust a resistance value thereof according to the pull-up code PUCODE<0:N>.

The second comparator 670a may compare a level of a voltage generated on the fourth node N4 with the level of the second reference voltage $1/2$VDDQ and output the second comparison output signal CMPO2. A second counter 680a may output the first pull-down code PDCODE1<0:N> based on the second comparison output signal CMPO2. Although not shown, the second counter 680a may receive the selection signal SEL from the loop selector 230 of FIG. 2. For example, the second counter 680a may output the first pull-down code PDCODE1<0:N> the same as the first pull-down code PDCODE1<0:N> generated during the first loop when the selection signal SEL has a logic high level "H." A third counter 690a may output the second pull-down code PDCODE2<0:N> based on the second comparison output signal CMPO2. Although not shown, the third counter 690a may receive the selection signal SEL from the loop selector 230 of FIG. 2. For example, the third counter 690a may output the second pull-down code PDCODE2<0:N> generated during the second loop when the selection signal SEL has a logic high level "H." A first pull-down circuit 630a may receive the first pull-down code PDCODE1<0:N> during the second loop and set a second resistance value to be less than the first resistance value. In detail, the resistance value of the first pull-down circuit 630a may be affected by a process variation that may occur during a manufacturing of semiconductor memory device. A second pull-down circuit 640a may receive the second pull-down code PDCODE2<0:N> during the second loop and set a third resistance value to be greater than the first resistance value. In this regard, in an embodiment, an equivalent resistance value of the second resistance value and the third resistance value may be equal to the first resistance value.

In some embodiments, a resistance value of the ZQ resistor RZQ may be 120Ω. In this regard, when the second reference voltage ½VDDQ is input to the ZQ engine 600*a* in the second loop, a resistance value of the first pull-up circuit 610*a* may be 120Ω, a resistance value of the second pull-up circuit 620*a* may be 40Ω, the first resistance value may be 80Ω, the second resistance value of the first pull-down circuit 630*a* may be 80−α Ω, and the third resistance value of the second pull-down circuit 640*a* may be 80+α Ω. In this regard, a may be a positive number. Because the first pull-down circuit 630*a* and the second pull-down circuit 640*a* are connected in parallel, the resistance value of an equivalent resistance of the first pull-down circuit 630*a* and the second pull-down circuit 640*a* may be 40Ω.

Referring to FIG. 6B, a pull-up circuit 610*b* included in a DQ driver 600*b* may be turned off according to the pull-up code PUCODE<0:N> input during the second loop. In this case, the pull-up code PUCODE<0:N> input to the pull-up circuit 610*b* may be the pull-up code PUCODE<0:N> generated during the first loop. Although not shown, a logic circuit may receive the pull-up code PUCODE<0:N> and provide the pull-up code PUCODE<0:N> to turn off the pull-up circuit 610*b* during the second loop. A first pull-down circuit 620*b* may set the second resistance value to be less than the first resistance value according to the first pull-down code PDCODE1<0:N> input during the second loop. A second pull-down circuit 630*b* may set the third resistance value to be greater than the first resistance value according to the second pull-down code PDCODE2<0:N> input during the second loop. In this regard, in an embodiment, the equivalent resistance value of the second resistance value and the third resistance value may be equal to the first resistance value.

In some embodiments, the resistance value of the ZQ resistor RZQ may be 120Ω and the resistance value of the DQ resistor RDQ may be 40Ω. In this regard, when the second reference voltage ½VDDQ is input to the ZQ engine 600*a* in the second loop, the first resistance value may be 80Ω, the second resistance value of the first pull-down circuit 620*b* may be 80−α Ω, and the third resistance value of the second pull-down circuit 630*b* may be 80+α Ω. Because the first pull-down circuit 620*b* and the second pull-down circuit 630*b* are connected in parallel, a resistance value of the equivalent resistance of the first pull-down circuit 620*b* and the second pull-down circuit 630*b* may be 40Ω. A voltage having the same level as the level of the second reference voltage ½VDDQ may be generated on the DQ pad 602.

Referring to FIGS. 5A and 6A, each of the first pull-up circuits 510*a* and 610*a*, each of the second pull-up circuits 520*a* and 620*a*, each of the first pull-down circuits 530*a* and 630*a*, each of the second pull-down circuits 540*a* and 640*a*, each of the first comparators 550*a* and 650*a*, each of the second comparators 570*a* and 670*a*, each of the first counters 560*a* and 660*a*, each of the second counters 580*a* and 680*a*, and each of the third counters 590*a* and 690*a* may respectively correspond to the first pull-up circuit 310, the second pull-up circuit 320, the first pull-down circuit 330, the second pull-down circuit 340, the first comparator 350, the second comparator 370, the first counter 360, the second counter 380, and the third counter 390 of FIG. 3.

Referring to FIGS. 5B and 6B, each of the pull-up circuits 510*b* and 610*b*, each of the first pull-down circuits 520*b* and 620*b*, and each of the second pull-down circuits 530*b* and 630*b* may respectively correspond to the pull-up circuit 410, the first pull-down circuit 420, and the second pull-down circuit 430 of FIG. 4.

Figure 7:
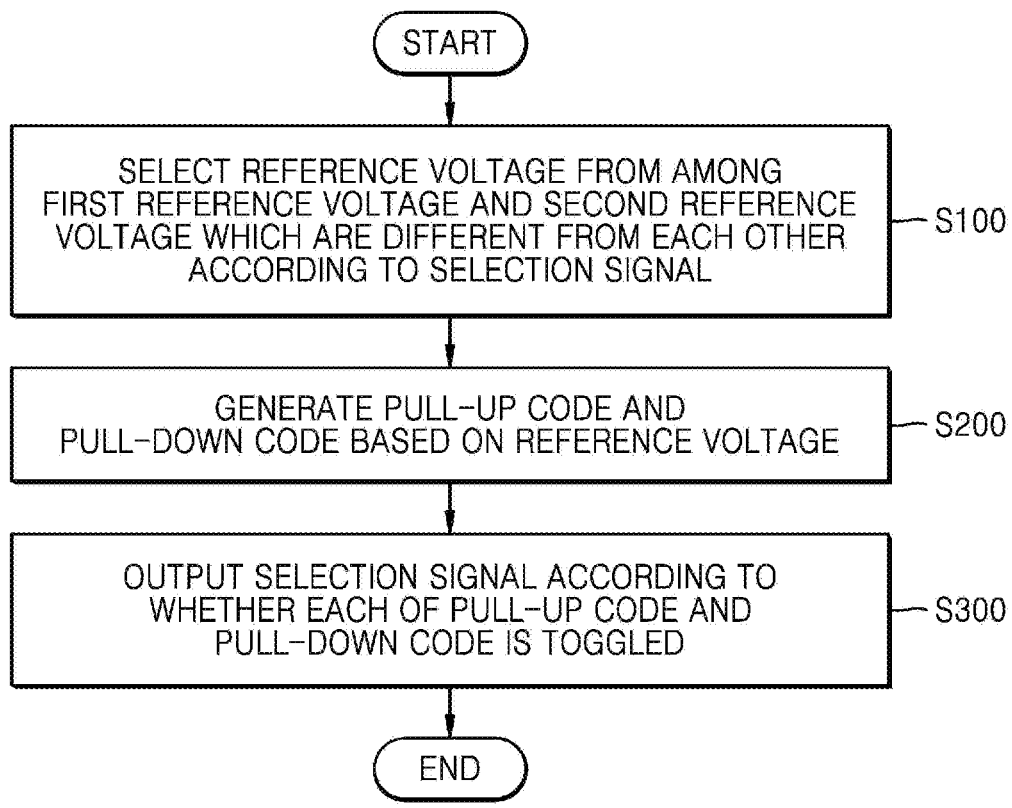
FIG. 7 is a flowchart illustrating an operation method of a ZQ calibration circuit according to some embodiments.

FIG. 7 is a flowchart illustrating an operation method of a ZQ calibration circuit according to some embodiments.

Referring to FIGS. 2 and 7, in operation S100, the reference voltage selector 210 selects a reference voltage from among the first reference voltage VREFZQ1 and the second reference voltage VREFZQ2 which are different from each other according to the selection signal SEL. The first reference voltage VREFZQ1 and the second reference voltage VREFZQ2 may be generated based on the first supply voltage VDDQ and the second supply voltage VSS. For example, levels of the first and second reference voltages VREFZQ1 and VREFZQ2 may be smaller than a level of the first supply voltage VDDQ and greater than a level of the second supply voltage VSS.

In operation S200, the ZQ engine 220 generates the pull-up code PUCODE<0:N> and the pull-down code PDCODE<0:N> based on the selected reference voltage (e.g., the first reference voltage VREFZQ1 or the second reference voltage VREFZQ2). The pull-down code PDCODE<0:N> may include the first pull-down code PDCODE1<0:N> and the second pull-down code PDCODE2<0:N> of FIG. 3.

In operation S300, the loop selector 230 outputs the selection signal SEL according to whether each of the pull-up code PUCODE<0:N> and the pull-down code PDCODE<0:N> is toggled.

Figure 8:
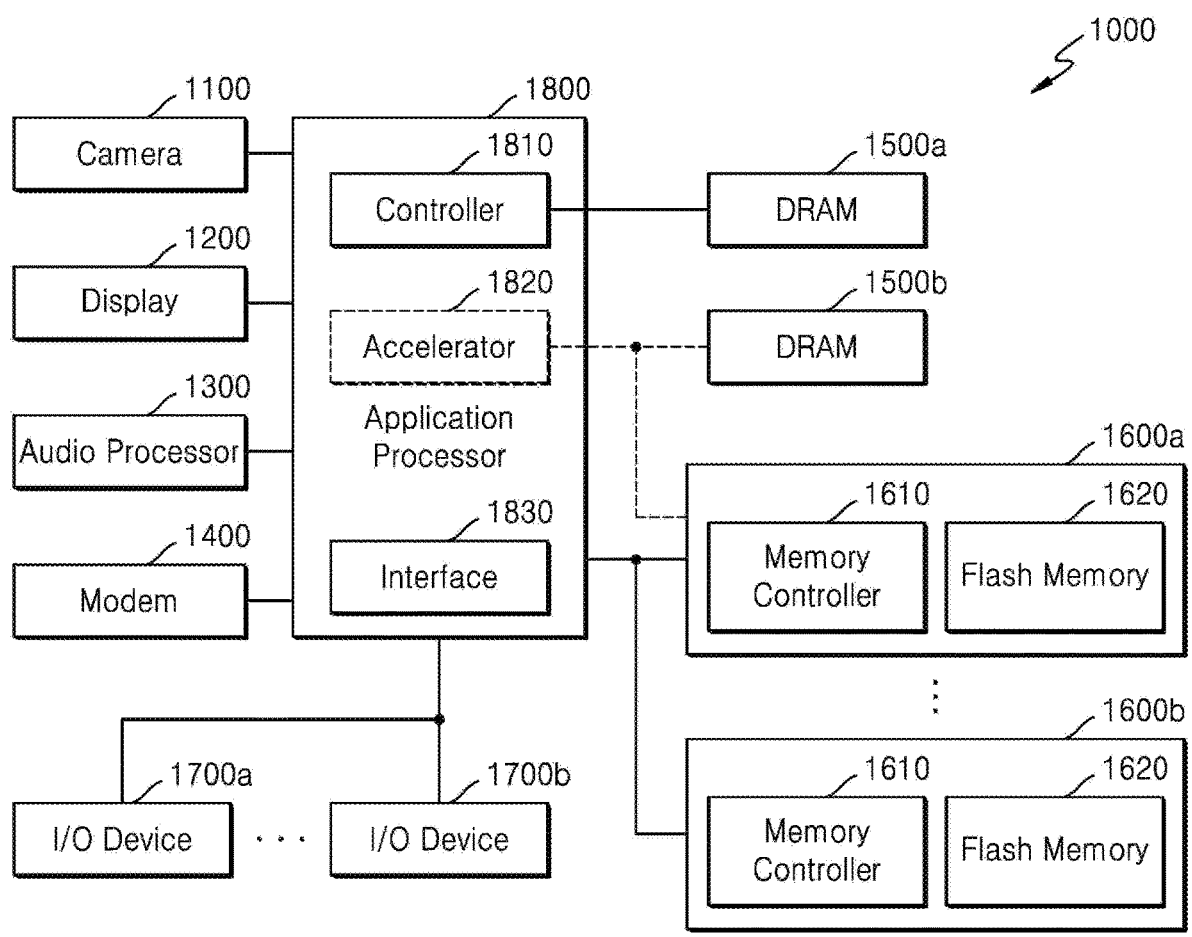
FIG. 8 is a block diagram illustrating an electronic system according to some embodiments.

FIG. 8 is a block diagram illustrating an electronic system according to some embodiments.

Referring to FIG. 8, an electronic system 1000 may be implemented as a laptop computer, a mobile phone, a smart phone, a tablet PC, a wearable device, a healthcare device, or an IoT device. Also, the electronic system 1000 may be implemented as a server or a PC.

The electronic system 1000 may include a camera 1100, a display 1200, an audio processor 1300, a modem 1400, volatile memories 1500*a* and 1500*b*, flash memory device 1600*a* and 1600*b*, I/O devices 1700*a* and 1700*b*, and an application processor (AP) 1800.

The camera 1100 may capture a still image or a moving image under the control of a user.

The audio processor 1300 may process audio data included in the flash memory devices 1600*a* and 1600*b* or network content.

The modem 1400 may modulate and transmit a signal for transmission/reception of wired/wireless data, and may demodulate the signal to restore the original signal at the receiving side.

The I/O devices 1700*a* and 1700*b* may include devices providing digital input and/or output functions.

The AP 1800 may control overall operations of the electronic system 1000. The AP 1800 may control the display 1200 to display part of the content. When a user input is received through the I/O devices 1700*a* and 1700*b*, the AP 1800 may perform a control operation corresponding to the user input. The AP 1800 may include an accelerator 1820, which is a dedicated circuit for calculating artificial intelligence (AI) data. The volatile memory 1500*b* may be additionally mounted on the accelerator 1820. The accelerator 1820 may be a functional block that specializes in performing a specific function of the AP 1800. The accelerator 1820 may include a graphics processing unit (GPU), a neural processing unit (NPU), and a data processing unit (DPU). The GPU may be a block that specializes in graphic data processing. The NPU may be a functional block that specializes in AI calculation and inference. The DPU may be a functional block that specializes in a data transmission.

The AP 1800 may control the volatile memories 1500*a* and 1500*b* through command and mode register setting (MRS) conforming to the Joint Electron Device Engineering Council (JEDEC) standard. In addition, the AP 1800 may set DRAM interface protocols to use company-specific functions such as low voltage/high speed/reliability and cyclic redundancy check (CRC)/error correction code (ECC) functions.

A controller 1810 included in the AP 1800 may correspond to the memory controller 110 described above with reference to FIG. 1.

The volatile memories 1500*a* and 1500*b* have relatively smaller latency and bandwidth than the I/O devices 1700*a* and 1700*b* or flash memories 1620 included in the flash memory devices 1600*a* and 1600*b*. The volatile memories 1500*a* and 1500*b* may be initialized when the electronic system 1000 is powered on, loaded with operating system and application data, and used as temporary storage for the operating system and the application data or used as an execution space for various software codes.

Addition/subtraction/multiplication/division operations, a vector operation, an address operation, or a fast Fourier transform (FFT) operation may be performed within the volatile memories 1500*a* and 1500*b*. In addition, a function for execution used for inference may be performed within the volatile memories 1500*a* and 1500*b*.

Each of the volatile memories 1500*a* and 1500*b* may correspond to the semiconductor memory device 100 of FIG. 1. Accordingly, each of the volatile memories 1500*a* and 1500*b* may include a ZQ pad and a DQ pad, and may include a ZQ calibration circuit and a DQ driver.

The flash memories 1620 may store photos taken through the camera 1100 or data transmitted through a data network. Each of the flash memories 1620 may have a larger capacity than each of the volatile memories 1500*a* and 1500*b*.

While the inventive concept has been particularly shown and described with reference to embodiments thereof, it will be understood that various changes in form and details may be made therein without departing from the spirit and scope of the following claims.

What is claimed is:

1. A ZQ calibration circuit included in a semiconductor memory device, the ZQ calibration circuit comprising:
   a reference voltage selector configured to output a reference voltage selected from among a first reference voltage and a second reference voltage generated based on a first supply voltage and a second supply voltage, in response to a selection signal;
   a ZQ engine configured to generate a pull-up code and a pull-down code based on the selected reference voltage; and
   a loop selector configured to output the selection signal according to whether each of the pull-up code and the pull-down code is toggled,
   wherein levels of the first and second reference voltages are different from each other, smaller than a level of the first supply voltage, and greater than a level of the second supply voltage.

2. The ZQ calibration circuit of claim 1, wherein the ZQ calibration circuit is configured to perform a ZQ calibration operation during a first loop and a second loop after the first loop, and
   wherein the reference voltage selector is further configured to:
   provide the first reference voltage to the ZQ engine as the selected reference voltage during the first loop, and
   provide the second reference voltage to the ZQ engine as the selected reference voltage during the second loop.

3. The ZQ calibration circuit of claim 1, wherein the ZQ engine includes:
   a first comparator connected to a ZQ pad of the semiconductor memory device and configured to output a first comparison output signal based on a voltage generated on the ZQ pad and the selected reference voltage;
   a first counter configured to output the pull-up code based on the first comparison output signal;
   a first pull-up circuit connected between a first node to which the first supply voltage is supplied and a second node connected to the ZQ pad, and configured to adjust a resistance value of the first pull-up circuit in response to the pull-up code;
   a second pull-up circuit connected between a third node to which the first supply voltage is supplied and a fourth node, and configured to adjust a resistance value of the second pull-up circuit in response to the pull-up code;
   a second comparator configured to output a second comparison output signal based on a voltage generated on the fourth node and the selected reference voltage;
   a second counter configured to output a first pull-down code based on the second comparison output signal;
   a first pull-down circuit connected between the fourth node and a fifth node to which the second supply voltage is supplied, and configured to adjust a resistance value of the first pull-down circuit in response to the first pull-down code;
   a third counter configured to output a second pull-down code based on the second comparison output signal; and
   a second pull-down circuit connected between the fourth node and a sixth node to which the second supply voltage is supplied, and configured to adjust a resistance value of the second pull-down circuit in response to the second pull-down code.

4. The ZQ calibration circuit of claim 3, wherein the first pull-up circuit includes:
   at least one p-type transistor including a first electrode connected to the first node, a second electrode, and a gate electrode configured to receive the pull-up code; and
   at least one resistor connected between the corresponding second electrode and the second node.

5. The ZQ calibration circuit of claim 3, wherein the second pull-up circuit includes:
   at least one p-type transistor including a first electrode connected to the third node, a second electrode, and a gate electrode configured to receive the pull-up code; and
   at least one resistor connected between the corresponding second electrode and the fourth node.

6. The ZQ calibration circuit of claim 3, wherein the first pull-down circuit includes:
   at least one resistor including a first terminal connected to the fourth node and a second terminal; and
   at least one n-type transistor including a first electrode connected to the corresponding second terminal, a second electrode connected to the fifth node, and a gate electrode configured to receive the first pull-down code.

7. The ZQ calibration circuit of claim 3, wherein the second pull-down circuit includes:

at least one resistor including a first terminal connected to the fourth node and a second terminal; and at least one n-type transistor including a first electrode connected to the corresponding second terminal, a second electrode connected to the sixth node, and a gate electrode configured to receive the second pull-down code.

8. The ZQ calibration circuit of claim 3, wherein:

the ZQ calibration circuit is configured to perform a ZQ calibration operation during a first loop and a second loop after the first loop, the second comparator is further configured to:

output the second comparison output signal in response to the first reference voltage during the first loop, and output the second comparison output signal in response to the second reference voltage during the second loop, the first pull-down circuit is further configured to:

set a first resistance value in response to the first pull-down code during the first loop, and set a second resistance value to be less than the first resistance value in response to the first pull-down code during the second loop, and the second pull-down circuit is further configured to:

be turned off in response to the second pull-down code during the first loop, and set a third resistance value to be greater than the first resistance value in response to the second pull-down code during the second loop.

9. The ZQ calibration circuit of claim 1, wherein:

the first supply voltage is greater than the second supply voltage, the first reference voltage is greater than the second reference voltage and less than the first supply voltage, and the second reference voltage is greater than the second supply voltage.

10. A semiconductor memory device comprising:

a ZQ pad;

a DQ pad;

a ZQ calibration circuit configured to perform a ZQ calibration operation by using a ZQ resistor connected to the ZQ pad and generate a ZQ code; and a DQ driver configured to determine a termination resistance value of the DQ pad based on the ZQ code, wherein the ZQ calibration circuit comprises:

a reference voltage selector configured to output a reference voltage selected from among a first reference voltage and a second reference voltage generated based on a first supply voltage and a second supply voltage, in response to a selection signal;

a ZQ engine configured to generate a pull-up code of the ZQ code and a pull-down code of the ZQ code based on the selected reference voltage; and a loop selector configured to output the selection signal according to whether each of the pull-up code and the pull-down code is toggled, wherein levels of the first and second reference voltages are different from each other, smaller than a level of the first supply voltage, and greater than a level of the second supply voltage.

11. The semiconductor memory device of claim 10, wherein the ZQ calibration circuit is configured to perform a ZQ calibration operation during a first loop and a second loop after the first loop, and wherein the reference voltage selector is further configured to:

provide the first reference voltage to the ZQ engine as the selected reference voltage during the first loop, and provide the second reference voltage from among the first reference voltage and the second reference voltage to the ZQ engine as the selected reference voltage during the second loop.

12. The semiconductor memory device of claim 10, wherein the ZQ engine includes:

a first comparator connected to the ZQ pad and configured to output a first comparison output signal based on a voltage generated on the ZQ pad and the selected reference voltage;

a first counter configured to output the pull-up code based on the first comparison output signal;

a first pull-up circuit connected between a first node to which the first supply voltage is supplied and a second node connected to the ZQ pad, and configured to adjust a resistance value of the first pull-up circuit in response to the pull-up code;

a second pull-up circuit connected between a third node to which the first supply voltage is supplied and a fourth node, and configured to adjust a resistance value of the second pull-up circuit in response to the pull-up code;

a second comparator configured to output a second comparison output signal based on a voltage generated on the fourth node and the selected reference voltage;

a second counter configured to output a first pull-down code based on the second comparison output signal;

a first pull-down circuit connected between the fourth node and a fifth node to which the second supply voltage is supplied, and configured to adjust a resistance value of the first pull-down circuit in response to the first pull-down code;

a third counter configured to output a second pull-down code based on the second comparison output signal; and a second pull-down circuit connected between the fourth node and a sixth node to which the second supply voltage is supplied, and configured to adjust a resistance value of the second pull-down circuit in response to the second pull-down code.

13. The semiconductor memory device of claim 12, wherein the first pull-up circuit includes:

at least one p-type transistor including a first electrode connected to the first node, a second electrode, and a gate electrode configured to receive the pull-up code; and at least one resistor connected between the corresponding second electrode and the second node.

14. The semiconductor memory device of claim 12, wherein the second pull-up circuit includes:

at least one p-type transistor including a first electrode connected to the third node, a second electrode, and a gate electrode configured to receive the pull-up code; and at least one resistor connected between the corresponding second electrode and the fourth node.

15. The semiconductor memory device of claim 12, wherein the first pull-down circuit includes:

at least one resistor including a first terminal connected to the fourth node and a second terminal; and at least one n-type transistor including a first electrode connected to the corresponding second terminal, a second electrode connected to the fifth node, and a gate electrode configured to receive the first pull-down code.

16. The semiconductor memory device of claim 12, wherein the second pull-down circuit includes:
- at least one resistor including a first terminal connected to the fourth node and a second terminal; and
- at least one n-type transistor including a first electrode connected to the corresponding second terminal, a second electrode connected to the sixth node, and a gate electrode configured to receive the second pull-down code.

17. The semiconductor memory device of claim 12, wherein the DQ driver includes:
- a DQ pull-up circuit connected between a line to which the first supply voltage is supplied and an output node, and configured to adjust the resistance value of the DQ pull-up circuit in response to the pull-up code;
- a first DQ pull-down circuit connected between the output node and a line to which the second supply voltage is supplied, and configured to adjust a resistance value of the first DQ pull-down circuit in response to the first pull-down code; and
- a second DQ pull-down circuit connected between the output node and the line to which the second supply voltage is supplied, and configured to adjust a resistance value of the second DQ pull-down circuit in response to the second pull-down code.

18. The semiconductor memory device of claim 17, wherein:
- the ZQ calibration circuit is configured to perform a ZQ calibration operation during a first loop and a second loop after the first loop,
- the second comparator is further configured to:
- output the second comparison output signal in response to the first reference voltage during the first loop, and
- output the second comparison output signal in response to the second reference voltage during the second loop,
- the first pull-down circuit is further configured to:
- set a first resistance value in response to the first pull-down code during the first loop, and
- set a second resistance value to be less than the first resistance value in response to the first pull-down code during the second loop, and
- the second pull-down circuit is further configured to:
- be turned off in response to the second pull-down code during the first loop, and
- set a third resistance value to be greater than the first resistance value in response to the second pull-down code during the second loop.

19. The semiconductor memory device of claim 18, wherein:
- the DQ pull-up circuit is further configured to:
- set the first resistance value in response to the pull-up code during the first loop, and
- be turned off in response to the pull-up code during the second loop,
- the first DQ pull-down circuit is further configured to:
- set the first resistance value in response to the first pull-down code during the first loop, and
- set the second resistance value in response to the first pull-down code during the second loop, and
- the second DQ pull-down circuit is further configured to:
- be turned off in response to the second pull-down code during the first loop, and
- set the third resistance value in response to the second pull-down code during the second loop.

20. An operation method of a ZQ calibration circuit, the operation method comprising:
- generating a first reference voltage and a second reference voltage based on a first supply voltage and a second supply voltage;
- selecting a reference voltage from among the first reference voltage and the second reference voltage according to a selection signal;
- generating a pull-up code and a pull-down code based on the selected reference voltage; and
- generating the selection signal according to whether each of the pull-up code and the pull-down code is toggled,
- wherein levels of the first and second reference voltages are different from each other, smaller than a level of the first supply voltage, and greater than a level of the second supply voltage.

* * * * *